United States Patent [19]

Day et al.

[11] Patent Number: 5,304,457
[45] Date of Patent: * Apr. 19, 1994

[54] COMPOSITION FOR PHOTO IMAGING

[75] Inventors: Richard A. Day, Whitney Point, N.Y.; Jeffrey D. Gelorme, Plainville, Conn.; David J. Russell, Apalachin, N.Y.; Stephen J. Witt, Austin, Tex.

[73] Assignee: International Business Machines Corporation, Armonk, N.Y.

[*] Notice: The portion of the term of this patent subsequent to Jun. 25, 2008 has been disclaimed.

[21] Appl. No.: 956,836

[22] Filed: Oct. 5, 1992

Related U.S. Application Data

[63] Continuation of Ser. No. 632,032, Dec. 21, 1990, abandoned, which is a continuation-in-part of Ser. No. 318,536, Mar. 3, 1989, Pat. No. 5,026,624.

[51] Int. Cl.$^5$ .............................................. G03C 1/725
[52] U.S. Cl. ................................... 430/280; 522/31; 522/170; 525/482
[58] Field of Search .............. 430/280; 522/31, 170; 525/482

[56] References Cited

U.S. PATENT DOCUMENTS

| | | | |
|---|---|---|---|
| 3,794,576 | 2/1974 | Watt | 430/280 |
| 4,058,401 | 11/1977 | Crivello | 96/115 |
| 4,069,055 | 1/1978 | Crivello | 96/115 |
| 4,081,276 | 3/1978 | Crivello | 96/35.1 |
| 4,138,255 | 2/1979 | Crivello | 430/280 |
| 4,175,963 | 11/1979 | Crivello | 430/296 |
| 4,250,053 | 2/1981 | Smith | 252/426 |
| 4,279,985 | 7/1981 | Nonogaki et al. | 430/280 |
| 4,351,708 | 9/1982 | Berner | 522/25 |
| 4,442,197 | 4/1984 | Crivello | 430/280 |
| 4,544,623 | 10/1985 | Audykowski | 430/280 |
| 4,546,067 | 10/1985 | Irving et al. | 430/325 |
| 4,548,890 | 10/1985 | Dickinson | 430/200 |
| 4,548,895 | 10/1985 | Irving et al. | 430/325 |
| 4,624,912 | 11/1986 | Zweifel | 430/258 |
| 4,659,649 | 4/1987 | Dickinson | 430/280 |
| 4,684,671 | 8/1987 | Tsuchiya | 522/31 |
| 4,693,961 | 9/1987 | Bauer | 430/280 |
| 4,735,891 | 4/1988 | Budde et al. | 430/313 |
| 4,940,651 | 7/1990 | Brown et al. | 430/280 |

*Primary Examiner*—Marion E. McCamish
*Assistant Examiner*—Mark A. Chapman
*Attorney, Agent, or Firm*—Calfee, Halter & Griswold

[57] ABSTRACT

An improved photoimagable cationically polymerizable epoxy based coating material is provided. The material includes an epoxy resin system consisting essentially of between about 10% and about 80% by weight of a polyol resin which is a condensation product of epichlorohydrin and bisphenol A having a molecular weight of between about 40,000 and 130,000; between about 20% and about 90% by weight of an epoxidized octafunctional bisphenol A formaldehyde novolak resin having a molecular weight of 4,000 to 10,000; and if flame retardancy is required between about 35% and 50% by weight of an epoxidized glycidyl ether of tetrabromo bisphenol A having a softening point of between about 60° C. and about 110° C. and a molecular weight of between about 600 and 2,500. To this resin system is added about 0.1 to about 15 parts by weight per 100 parts of resin of a cationic photoinitiator capable of initiating polymerization of said epoxidized resin system upon exposure to actinic radiation; the system being further characterized by having an absorbance of light in the 330 to 700 nm region of less than 0.1 for a 2.0 mil thick film. Optionally a photosensitizer such as perylene and its derivatives or anthracene and its derivatives may be added.

14 Claims, No Drawings

COMPOSITION FOR PHOTO IMAGING

CROSS-REFERENCE TO RELATED APPLICATION

This application is a continuation of co-pending application Ser. No. 07/632,032 filed Dec. 21, 1990 now abandoned which is a continuation in part of co-pending application Ser. No. 07/318,536 filed Mar. 3, 1989 which application issued as U.S. Pat. No. 5,026,624 on Jun. 25, 1991.

FIELD OF THE INVENTION

This invention relates generally to photoimagable compositions, and more particularly to a cationically polymerizable epoxy resin system having photoinitiators and optionally photosensitizers added thereto which resin system has improved rheological properties and also improved photoimaging properties.

BACKGROUND OF THE INVENTION

There are many different instances where photoimagable compositions are utilized in various industrial processes. In one particular process a photoimageable composition is utilized as a solder mask by applying the composition to the underlying printed circuit board. Thereafter photolithographic techniques are employed to reveal various underlying structures on the board while masking others so that solder may be applied by various solder applying processes to the exposed structures. During the solder applying process the solder will adhere to the exposed underlying components and be prevented from adhering where the remaining material operates as a solder mask.

It is necessary that the solder mask material be formulated such that it can be applied by the appropriate methods; for example curtain coating, a preferred method, requires certain rheological properties for effective coating. Further, the solder mask must have the properties of providing efficient transmission of the light or other exposing radiation so as to photolyze the photoinitiator through whatever thickness of material is applied. Also, of course, if the material is to be used as a solder mask, the solder mask must possess appropriate physical and chemical properties to withstand the application of the solder material without significant deterioration or degradation and maintain its coverage over the portions of the board wherein solder is to be masked. If it is to be used for other purposes, other properties may be required.

There have been many prior art proposals for different photoimageable compositions including many that use epoxies. Examples of these are found in the following U.S. Patents: U.S. Pat. Nos. 4,279,985; 4,548,890; 4,351,708; 4,138,255; 4,069,055; 4,250,053; 4,058,401; 4,659,649; 4,544,623; 4,684,671; 4,624,912; 4,175,963; 4,081,276; 4,693,961; and 4,442,197. All of these patents show Various resins and photoinitiators for use in photoimageable compositions many of which are useful as solder masks. However none of them teach or suggest the specific composition of the present invention.

SUMMARY OF THE INVENTION

According to the present invention, an improved photoimagable cationically polymerizable epoxy based coating material is provided. The material includes an epoxy resin system consisting essentially of between about 10% and about 80% by weight of a polyol resin which is a condensation product of epichlorohydrin and bisphenol A having a molecular weight of between about 40,000 and 130,000; between about 20% and about 90% by weight of an epoxidized octafunctional bisphenol A formaldehyde novolak resin having a molecular weight of 4,000 to 10,000; and between about 35% and 50% by weight of an epoxidized glycidyl ether of tetrabromo bisphenol A having a melting point of between about 90° C. and about 110° C. and a molecular weight of between about 600 and 2,500 if flame retardant properties are desired. To this resin system is added about 0.1 to about 15 parts by weight per 100 parts of resin of a cationic photoinitiator capable of initiating polymerization of said epoxidized resin system upon exposure to actinic radiation; optionally a photosensitizer in an amount of up to about 10 parts by weight may be added to enable/enhance exposure at other wave lengths; the resin system exclusive of the photoinitiator and sensitizer being further characterized by having an absorbance of light in the 330 to 700 nm region of less than 0.1 for a 2.0 mil thick film.

DESCRIPTION OF THE PREFERRED EMBODIMENT

The present invention provides a photoimageable coating material which incorporates a cationically polymerizable epoxy resin system having a photoinitiator and optionally a photosensitizer therein. The epoxy resin system of this invention contains/consists essentially of a polyol resin having epoxy functionality, an epoxidized novolak resin, and an epoxidized bromonated bisphenol resin. The system was specifically developed for application by curtain coating techniques and for use as a solder mask on a printed circuit substrate. However, the system can be used for other applications, such as an etch mask, and also can be coated by other techniques such as roller coating. In this particular solder mask application, the photoimageable material is typically curtain coated by conventional curtain coating techniques onto a substrate to a thickness of about 0.5 to about 4.0 mils or more, dried, photoimaged and developed. The developed areas reveal the desired underlying metallized portions of the substrate wherein solder is to be applied, and the remaining solder mask material is cured and remains on the board as a solder mask during the application of solder by any conventional technique. Thus the system of this invention must have satisfactory rheological properties for application by curtain coating techniques, it must be sensitive to exposure to radiation, which conventionally is in the 330 to 700 nm region, without any significant absorption to thereby allow penetration of the exposure radiation completely through the film; and it must also have the necessary physical and chemical properties to resist degradation during the soldering process. Conventionally the solder mask remains on the board after soldering and hence for many applications must be fire or flame retardant. In formulating such a coating there are many competing considerations that must be considered in order to provide a desired end product. No specific type of epoxy resin has been found which will satisfy all of the various requirements; however, a formulation of a combination or mixture of various epoxy resins according to this invention provides the required properties for a curtain coatable photoimageable flame retardant solder mask composition.

In general, the epoxy resin system consists essentially of a phenoxy polyol resin of a high molecular weight which is a condensation product between epichlorohydrin and bisphenol A. A suitable resin of this type is sold by Union Carbide Corporation under the Trade Mark PKHC. This resin has an epoxide value of about 0.03 equivalents per kg, a weight per epoxide of about 37,000, and a Tg (glass transition temperature) of about 98° C. The second resin in the system is an epoxidized octafunctional bisphenol A formaldehyde novolak resin with a medium range molecular weight. A suitable resin of this type is sold by High Tek Polymers under the Trade Mark EpiRez SU-8. This resin has an epoxide value of about 4.7 equivalents per kg, a weight per epoxide of about 215 and a melting point of about 82° C. These two resins will provide the necessary rheological, photolithographic and physical properties necessary to curtain coat for solder mask applications. However, in many instances, flame retardancy is desirable, and these two resins do not exhibit adequate flame retardancy for many applications. In such cases a third resin is added for flame retardancy. The third resin in the system is a low molecular weight high softening point epoxidized glycidyl ether of tetrabromo bisphenol A. A suitable resin of this type is also sold by High Tek Polymers Corporation under the Trade Mark EpiRez 5183. This resin has an epoxide value of about 1.5 equivalents per kg, a weight per epoxide of about 675, and a melting point of about 97° C. A photoinitiator such as various sulfonium salts, iodonium salts, and ferrocene salts is added to the resin system for providing the proper photoresponse to actinic radiation. Since the resin system is cationically photocurable, the photoinitiator must be capable of causing cationic polymerization of the resin upon exposure to radiation. One particularly desirable photoinitiator is a complex triarylsulfonium hexafluoroantimonate salt sold by General Electric Company under the Trade Mark UVE 1014. Other photoinitiators such triphenylsulfonium hexafluorophosphate sold by General Electric Co. under the Trade Mark UVE 1016, and diphenyliodonium hexafluoroantimate may be used. Optionally a photosensitizer such as anthracene or its derivatives or perylene or its derivatives can also be added which may increase the response speed of photoimaging and/or the wavelenth sensitivity. The different epoxy resins described above, selected to be within certain molecular weight ranges, are blended in certain percentages.

It has been found generally that from about 10% to 80% of the polyol resin is preferred with the molecular weight being generally in the range of 40,000 to 130,000, and 20% to 90% of the epoxidized novolak resin is preferred with a molecular weight of between about 4,000 and 10,000. This is the most general case in which flame retardancy is not a criterion. However, flame retardancy is quite often a desirable if not required property. In such cases, it has been found that generally about 20% to 40% and preferably 25% to 35% of the polyol resin can be used with the molecular weight being generally in the range of 40,000 to 130,000 and more specifically and preferably in the range of 60,000 to 90,000. About 25% to 35% and preferably 25% to 30% of the epoxidized novolak resin can be used with a molecular weight generally of about 4,000 to 10,000 and preferably from about 5,000 to 7,000. About 35% to 50% epoxidized brominated bisphenol A is desirable and more preferably about 40% to 45% with a molecular weight of generally about 600 to 2,500 and preferably about 1,000 to 1,700 can be used. The photoinitiator, and optionally if desired the photosensitizer is added to the resin system. From about 0.1 and about 15 parts by weight of the photoinitiator based on 100 parts of the resin system are normally what is required and optionally up to about parts by weight of a photosensitizer based on 100 parts of the resin system can be used. (It is conventional practice in the art of photoimaging to designate the percentage of the components of the resin system to add up to 100% and to designate the additions or additives thereto in values of parts by weight based on 100 parts of the resin system, and this convention is adopted herein.)

The specific composition is selected to optimize the desired properties. For example, the PKHC controls the rheology of the coated materials, the 5183 imparts flame retardant properties to the material, and the SU-8 imparts fast photo speed and improved resolution. In selecting the specific amount of each resin it will of course be understood that by increasing the concentration of any one of the resins, this would also increase the respective property associated with it; however, increasing the concentration of any one of the specific resins would require a decrease in the concentration of one or both of the remaining resins which would result in a decrease of the function of the specific properties associated therewith. A decrease in any of the resins below the broad range percentages indicated above would result in properties which are unacceptable for the specific purpose of curtain coatable flame retardant high resolution photoimageable solder mask material.

As the PKHC amount is decreased, the resulting rheology results in a reduced coverage when the material is applied and the resulting material is extremely brittle. By reducing the 5183, the resulting system has decreased flame retardant characteristics and, if present below the minimum specified broad range, the flame retardant qualities would not meet certain specified industry requirements, e.g. UL 94 VO Flammability Requirements. However, any amount of the 5183 does provide some flame retardant characteristics. When the SU-8 concentration is reduced, a slower photospeed and lower resolution results to the extent that if it is decreased below the minimal level as given above, the photo speed is unacceptable for this particular application. Thus in balancing the formulation of the material, all of these requirements must be considered and the en product optimized to give satisfactory properties for the result desired.

The following four formulations were found to perform very well as solder mask compositions:

TABLE I

| Exam. | PKHC % | EpiRez 5183 % | SU-8 % | UVE 1014 PARTS/WT. | Tg(a) Coating | Tg(b) Coated | Log G'(a)(c) @ 100° C. |
|---|---|---|---|---|---|---|---|
| 1 | 20.0 | 50.0 | 30.0 | 5 | 73 | | 5.5 |
| 2 | 27.3 | 45.4 | 27.3 | 5 | 75 | | 5.9 |
| 3 | 33.3 | 41.7 | 25.5 | 5 | 78 | | 6.1 |

TABLE I-continued

| Exam. | PKHC % | EpiRez 5183 % | SU-8 % | UVE 1014 PARTS/ WT. | Tg(a) Coating | Tg(b) Coated | Log G'(a)(c) @ 100° C. |
| --- | --- | --- | --- | --- | --- | --- | --- |
| 4 | 30.0 | 45.0 | 25.0 | 5 | 78 | 125 | 6.4 |

(a) Determined by a Rheometrics Dynamic Spectrometer, Model 7700 with 1" parallel plates.
(b) Determined using a Perkin-Elmer DSC7.
(c) This is the log of the storage modulus @ 100° C.

Each example was mixed in a propylene glycol monomethyl ether acetate (PGMEA) solvent, these formulations being about 40% solids in the PGMEA. Each of these particular formulations in this solvent coated very well onto a circuit board. However, other moderately polar solvents can be used such as propylene glycol monomethyl ether, 2-methoxyethanol, 2-methoxyethyl acetate, 2-ethxyethyl acetate, N-methyl pyrrolidone, propylene carbonate, or gamma-butyrolactone.

The preferred formulation for a solder mask is in Example 4.

The following curtain coating techniques were used involving the application of the photoimageable material to a substrate via a free falling "curtain" of material. As the substrate passes through the curtain, it is coated with the material. The curtain coating set-up includes a pan, pump, viscosity controller, and a coating head. The material to be coated is pumped from the pan to the coating head, where the curtain is formed. This curtain falls back down into the pan, recirculating constantly, with exception of the material deposited onto substrates as they pass through the curtain. The coating viscosities range from 200–2,000 Cps, and typically dried film thicknesses deposited on the substrate range from 0.5.–4.0 mils.

Other types of coating, such as roll coating and wound wire rod coating, can also be used.

These particular formulations of epoxy resins and photoinitiators coated extremely well by the curtain coating methods without any spaces or gaps and covered the circuit board to a thickness of about 2 mils. During the photoimaging process, the light penetrated essentially completely through the coating to the underlying structure; thus the coating exclusive of the photoinitiator and sensitizer was transparent to this particular light, i.e. had an absorbance of less than 0.1 for the 2.0 mil thick film.

The solder mask material was exposed to UV radiation from a medium pressure mercury lamp. The UV radiation was passed through a phototool which is opaque in those area where the solder mask is to be removed. After exposure to UV radiation, the circuit boards were baked for a short time to accelerate the crosslinking reaction initiated by the sulfonium salt photolysis products. Bake temperatures between 100 C and 150 C and times between 2 and 10 minutes were used. The solder mask was then developed using a solvent that easily dissolves any unexposed material. The preferred developer is DY90 sold by Ciba-Geigy which contains gamma Butyrolactone, Propylene Carbonate, and Diglyme; however, Butyrolactone alone works well as a developer. Spray developing equipment and other physical agitation of developer solution was used. Curing of the solder mask was accomplished by exposing the solder mask to UV radiation followed by an oven bake at 150 C. UV doses varied from 1 to 4 Joules/sq cm. Bake times varied from 30 to 90 minutes. The Tg values as applied for all four examples and as cured for Example 4 are shown in Table 1.

After removing surface oxides such as with a dilute HCl rinse and applying an antioxidant such as benzotriazole, circuit boards can be soldered using a variety of methods. Two of the processes used with solder mask described here are wave solder and vapor phase solder.

Wave solder involves placing components onto the circuit board, coating the metallic surfaces to be soldered with a flux and passing this assembly through a continuously flowing wave of molten solder. Vapor phase solder is accomplished by applying flux and solid solder to the exposed metallic surfaces on the board by screening or some other appropriate technique. After placing components on the board the assembly is passed through a vapor which is maintained at a temperature above the melting point of the solder.

Sample 4 was tested for solderability in a conventional manner using the following "solder shocking" test which is a common method of testing solder mask performance under typical soldering stresses seen in industrial processes.

The coated substrate is photoimaged, developed, and fully cured. The part is submersed in molten solder, maintained at 500° F.±25°, for 10–20 seconds. After the submersion into the solder, the part is allowed to cool to room temperature and inspected. Visual inspection for cracking, flaking, blistering, or noticeable degradation of the material is performed. If the solder shock does not physically degrade the material, as confirmed by visual inspection, then the solder mask passes the solder shock test criteria.

For some applications, certain additives to the formulation may be desired. For example, a fluorescent or color dye may be added for inspection or cosmetic purposes. These would be present normally in quantities of about 0.001 to about 1 part per 100 by weight. Examples of these types that have been used are malachite green oxalate, ethyl violet, and rhodamine B. Additionally for some coating applications, it may be desirable to use a surfactant, e.g. Fluorad FC 430 sold by 3M Corp. The Surfactant will normally be present in quantities of 0.01 to 1 part per 100 by weight. It will, of course, be understood that the additive must not significantly degrade the other properties of the coating. Table II below shows several examples of the preferred embodiment with various additives.

TABLE II

| Exam. | PKHC[a] | 5183[a] | SU-8[a] | UVE[b] 1014 | Surfactant[b,c] | DYE[b] |
| --- | --- | --- | --- | --- | --- | --- |
| 5 | 30 | 45 | 25 | 5 | 0.03 | — |
| 6 | 30 | 45 | 25 | 5 | | 0.05* |
| 7 | 30 | 45 | 25 | 5 | 0.03 | 0.05* |
| 8 | 30 | 45 | 25 | 5 | — | 0.05** |

TABLE II-continued

| Exam. | PKHC[a] | 5183[a] | SU-8[a] | UVE[b] 1014 | Surfactant[b,c] | DYE[b] |
|---|---|---|---|---|---|---|
| 9 | 30 | 45 | 25 | 5 | 0.03 | 0.05** |

NOTES:
[a] Percentage by weight.
[b] Parts per hundred parts resin, by weight.
[c] Fluorad FC 430
*Malachite Green
**Ethyl Violet Table III shows three examples where just PKHC and SU-8 are utilized. These are useful where flame retardancy is not required.

TABLE III

| Exam. | PKHC(a) | SU-8(a) | Log G' @ 100° C. |
|---|---|---|---|
| 10 | 50 | 50 | 6.3 |
| 11 | 73 | 27 | 6.7 |
| 12 | 25 | 75 | 4.3 |

(a) Percentage by weight.

Examples 10 and 11 have good characteristics for curtain coating and use as a solder mask. While example 12 has generally good properties it has a rather low Log G' at 100° C. With a value this low, it is not particularly useful in solder mask applications since it has reduced conformal properties, but it will find use in other applications.

Various other types of resin formulations were found to be unsatisfactory either rheologically and/or photolithographically.

This invention has been described specifically as a formulation for curtain coating solder mask material. However, it can be used for other purposes and may be applied by various other techniques. Also, other types of coating, such as roller coating can be used to apply the material. Where different uses and coating techniques are employed, certain modifications of the preferred material may be necessary to meet different requirements. For example, a different solvent may be desired for roller coating as opposed to curtain coating and the rheological properties may be varied from the optimum for curtain coating for the different types of uses.

While the invention has been described with a certain degree of particularity, various adaptations and modifications can be made without departing from the scope of the invention as defined in the appended claims.

What is claimed is:

1. A photosensitive cationically polymerizable epoxy based imaging system comprising:
   an epoxy based resin system having solids consistent essentially of between about 10% and about 80% by weight of a polyol resin having epoxy functionality and said polyol resin having a molecular weight of from about 40,000 to about 130,000;
   between about 20% and about 90% by weight of an epoxidized bromonated bisphenol A resin to impart flame resistance having a molecular weight of from about 4,000 to about 10,000;
   an effective amount up to about 50% by weight of an epoxidized bromonated bisphenol A resin having a molecular weight of from about 600 to about 2,500 to impart flame resistance;
   from about 0.1 to about 15 parts by weight of a cationic photoinitiator capable of initiating polymerization in said epoxidized resin system upon exposure to actinic radiation;
   said resin system being further characterized by having an absorbance of light in the 330 to 700 nm region of less than 0.1 for a 2.0 mil thick film.

2. The invention as defined in claim 1 wherein the molecular weight of the polyol resin is between about 40,000 and about 130,000 and the molecular weight of the polyepoxy resin is between about 4,000 and about 10,000.

3. The invention as defined in claim 1 wherein the photoinitiator is a sulfonium salt.

4. The invention as defined in claim 1 further characterized by said resin system being in a moderately polar solvent.

5. The invention as defined in claim 4 wherein said solvent is propylene glycol monomethyl ether acetate.

6. The invention as defined in claim 4 wherein there is a concentration of about 40% epoxy resin system solids in the solvent.

7. The invention as defined in claim 1, wherein the polyol resin is a condensation product of epichlorohydrin and bisphenol A.

8. The invention as defined in claim 1, wherein the epoxidized novolak resin is an epoxidized octafunctional bisphenol A formaldehyde novolak resin.

9. The invention as defined in claim 1, wherein the epoxidized bromonated bisphenol A resin is an epoxidized glycidyl ether of tetrabromo bisphenol A.

10. A photosensitive cationically polymerizable epoxy based imaging system comprising:
    an epoxy resin system having solids consisting essentially of between about 10% and about 80% by weight of a polyol resin having epoxy functionality and a molecular weight of between about 40,000 and about 130,000;
    between about 20% and about 90% by weight of an epoxidized novolak resin having a molecular weight between about 4,000 and about 10,000;
    from about 0.1 to about 15 parts by weight of a cationic photoinitiator capable of initiating polymerization in said epoxidized resin system upon exposure to actinic radiation;
    said resin system being further characterized by having an absorbance of light in the 330 to 700 nm region of less than 0.1 for a 2.0 mil thick film.

11. The invention as defined in claim 10, wherein the polyol resin is a condensation product of epichlorohydrin and bisphenol A.

12. The invention as defined in claim 10, wherein the epoxidized novolak resin is an epoxidized octafunctional bisphenol A formaldehyde novolak resin.

13. A photosensitive cationically polymerizable epoxy based imaging system comprising:
    an epoxy resin system having solids consisting essentially of between about 10% and about 80% by weight of a polyol resin having epoxy functionality wherein said polyol resin is a condensation product of epichlorohydrin and bisphenol A and said polyol resin having a molecular weight of from about 40,000 to about 130,000;
    between about 20% and about 90% by weight of an epoxidized octafunctional bisphenol A formaldehyde novolak resin having a molecular weight of from about 4,000 to about 10,000;
    an effective amount up to about 50% by weight of an epoxidized glycidyl ether of tetrabromo bisphenol A resin having a molecular weight of from about 600 to about 2,500 to impart flame resistance;

from about 0.1 to about 15 parts by weight of a cationic photoinitiator capable of initiating polymerization in said epoxidized resin system upon exposure to actinic radiation;

said resin system being further characterized by having an absorbance of light in the 330 to 700 nm region of less than 0.1 for a 2.0 mil thick film.

14. A photosensitive cationically polymerizable epoxy based imaging system comprising:

an epoxy resin system having solids consisting essentially of between about 10% and about 80% by weight of a polyol resin having epoxy functionality wherein said polyol resin is a condensation product of epichlorohydrin and bisphenol A and a molecular weight of between about 40,000 and about 130,000;

between about 20% and about 90% by weight of an epoxidized octafunctional bisphenol A formaldehyde novolak resin having a molecular weight between about 4,000 and about 10,000;

from about 0.1 to about 15 parts by weight of a cationic photoinitiator capable of initiating polymerization in said epoxidized resin system upon exposure to actinic radiation;

said resin system being further characterized by having an absorbance of light in the 330 to 700 nm region of less than 0.1 for a 2.0 mil thick film.

* * * * *